United States Patent
Jo et al.

(10) Patent No.: US 12,495,586 B2
(45) Date of Patent: Dec. 9, 2025

(54) SUPERJUNCTION SEMICONDUCTOR DEVICE AND METHOD OF MANUFACTURING SAME

(71) Applicant: DB HiTek Co., Ltd., Bucheon-si (KR)

(72) Inventors: Min Gi Jo, Seoul (KR); Myeong Bum Pyun, Incheon (KR); Jin Young Goh, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 449 days.

(21) Appl. No.: 18/146,629

(22) Filed: Dec. 27, 2022

(65) Prior Publication Data

US 2023/0223436 A1    Jul. 13, 2023

(30) Foreign Application Priority Data

Jan. 11, 2022   (KR) ................ 10-2022-0003880

(51) Int. Cl.
*H10D 62/10* (2025.01)
*H10D 30/66* (2025.01)
*H10D 62/17* (2025.01)

(52) U.S. Cl.
CPC ......... *H10D 62/111* (2025.01); *H10D 30/665* (2025.01); *H10D 62/393* (2025.01)

(58) Field of Classification Search
CPC .. H10D 62/111; H10D 30/665; H10D 62/393; H10D 30/0291; H10D 62/127; H10D 62/106
USPC ....................................................... 257/330
See application file for complete search history.

(56) References Cited

U.S. PATENT DOCUMENTS

| | | | |
|---|---|---|---|
| 7,301,203 B2 | 11/2007 | Lee et al. | |
| 7,655,981 B2 | 2/2010 | Lee et al. | |
| 8,735,982 B2* | 5/2014 | Onishi | H10D 30/665 257/342 |
| 12,453,139 B2* | 10/2025 | Huang | H10D 62/127 |
| 2003/0176031 A1* | 9/2003 | Onishi | H10D 30/665 257/E29.174 |
| 2003/0222327 A1* | 12/2003 | Yamaguchi | H10D 64/111 257/500 |
| 2005/0116313 A1 | 6/2005 | Lee et al. | |
| 2006/0033153 A1* | 2/2006 | Onishi | H10D 62/111 257/E29.257 |
| 2008/0211053 A1 | 9/2008 | Lee et al. | |
| 2015/0076599 A1* | 3/2015 | Cho | H10D 30/66 257/339 |
| 2017/0221989 A1* | 8/2017 | Hirler | H10D 30/668 |

FOREIGN PATENT DOCUMENTS

KR    10-2005-0052597 A    6/2005

* cited by examiner

*Primary Examiner* — Mohammad M Hoque
(74) *Attorney, Agent, or Firm* — Central California IP Group, P.C.; Andrew D. Fortney

(57) ABSTRACT

Disclosed are a superjunction semiconductor device and a method of manufacturing the same. More particularly, the superjunction semiconductor device includes at least one body region in a second corner region extending along the length direction in the same manner as a pillar, thereby promoting smooth current flow in a transition corner region and thus improving reverse recovery characteristics; and a method of manufacturing the superjunction semiconductor device.

18 Claims, 16 Drawing Sheets

SUPERJUNCTION SEMICONDUCTOR DEVICE AND METHOD OF MANUFACTURING SAME

CROSS REFERENCE TO RELATED APPLICATION

The present application claims priority to Korean Patent Application No. 10-2022-0003880, filed Jan. 11, 2022, the entire contents of which are incorporated herein for all purposes by this reference.

BACKGROUND OF THE INVENTION

Field of the Invention

The present disclosure relates generally to a superjunction semiconductor device and a method of manufacturing the same. More particularly, the present disclosure relates to a superjunction semiconductor device having at least one body region in a second corner region extending along a predetermined direction (e.g., along a length) in the same manner as a pillar, thereby promoting smooth current flow in a transition corner region and thus improving reverse recovery characteristics; and a method of manufacturing the superjunction semiconductor device.

Description of the Related Art

In the case of high-voltage power metal-oxide-semiconductor field-effect transistors (MOSFETs), in order to increase the breakdown voltage to improve high voltage characteristics, there is a need to increase the specific resistance and thickness of the drift region in the MOSFET. However, due to the fact that the breakdown voltage is proportional to the on-resistance, the increase in the specific resistance causes an increase in the on-resistance.

In an attempt to solve such a problem, superjunction power MOSFETs having alternating p-type and n-type regions under the active region have been introduced. The alternating p-type and n-type regions are ideal for charge balancing so that they deplete each other under reverse voltage conditions, and thus, are highly resistant to breakdown. Accordingly, the use of superjunction power MOSFETs having so-called "stripe" pillars, with high-voltage characteristics and low on-resistance characteristics compared to existing planar power MOSFETs, is increasing.

FIG. 1 is a plan view illustrating a superjunction semiconductor device 9 according to the related art. FIG. 2 is a cross-sectional view illustrating the superjunction semiconductor device 9 illustrated in FIG. 1 taken along line a-a'.

Referring to FIGS. 1 and 2, the related-art superjunction semiconductor device 9 includes an epitaxial layer 910 and a plurality of pillars 920 in the epitaxial layer 910, spaced apart from each other along the width direction of the device 9. In addition, the superjunction semiconductor device 9 includes a first body region 930 connected to an upper portion of each pillar 920 in the cell region C, and a second body region 941 in a transition region T. A first plurality of second body regions 941 in a second corner region T31 extend along the width direction and are spaced apart from each other along the length direction, and a second plurality of second body regions 942 in a first corner region T32 extend along the length direction and are spaced apart from each other along the width direction, similarly to the pillars 920. In addition, respective contacts 952 on the second body regions 941 and 942 are also aligned with the second body regions 941 and 942 therebelow.

Referring to FIG. 1, the second body regions 941 in the second corner region T31 cross the pillars 920 at an angle of about 90 degrees. In other words, since the axial directions of the pillars 920 and the second body regions 941 in the second corner region T31 do not coincide with each other, this limits easy movement of current when the device 9 is switched off. Consequently, reverse recovery characteristics in the second corner region T31 are inevitably relatively weak.

To overcome the above problems, the present inventors have conceived a novel superjunction semiconductor device with an improved structure and a method of manufacturing the same, described in detail below.

The foregoing is intended merely to aid in the understanding of the background of the present disclosure, and is not intended to mean that the present disclosure falls within the purview of the related art or that the present disclosure is already known to those skilled in the art.

Documents of Related Art

Korean Patent Application Publication No. 10-2005-0052597, entitled "Superjunction semiconductor device."

SUMMARY OF THE INVENTION

Accordingly, the present disclosure has been made keeping in mind the above problems occurring in the related art, and an objective of the present disclosure is to provide a superjunction semiconductor device, in which at least one body region (e.g., all body regions) in a second corner region (e.g., an entire corner region) extends along a length direction in the same manner as a pillar (e.g., an underlying pillar), thereby promoting smooth current flow in the corner region (e.g., a transition corner region) and thus improving reverse recovery characteristics, and to provide a method of manufacturing the superjunction semiconductor device.

Another objective of the present disclosure is to provide a superjunction semiconductor device, in which at least one body region (e.g., all body regions) in a second corner region (e.g., an entire corner region) extends along the length direction in the same manner as a pillar (e.g., the underlying pillar), thereby improving process efficiency by eliminating any need for a separate implant layer for improving reverse recovery characteristics, and to provide a method of manufacturing the same superjunction semiconductor device.

In order to achieve the above objectives, according to one aspect of the present disclosure, there is provided a superjunction semiconductor device including a substrate having a cell region and a transition region; an epitaxial layer on the substrate; a plurality of pillars in the epitaxial layer, extending along a length direction and spaced apart from each other along a width direction; a first body region in the epitaxial layer, electrically connected to a first one of the pillars in the cell region; and a second body region in the epitaxial layer, electrically connected to a second one of the pillars in the transition region, wherein at least a portion of the second body region may extend along the length direction and, when the superjunction semiconductor device includes a plurality of the second body regions, the plurality of the second body regions may be spaced apart from each other along the width direction.

According to another aspect of the present disclosure, the second body region may include a plurality of first transition body regions in a first part of the transition region; and a plurality of second transition body regions in a second part of the transition region, and wherein the first transition body regions may extend along the length direction and be spaced apart from each other along the width direction. The second part of the transition region may be separate from, but have an interface with, the first part of the transition region.

According to another aspect of the present disclosure, at least portions of the second transition body regions may be spaced apart from each other along the width direction, and each of the at least portions of the second transition body regions may correspond to each of the pillars in the second part of the transition region.

According to another aspect of the present disclosure, the superjunction semiconductor device may further include a gate on or over the epitaxial layer; an interlayer insulating layer covering the gate and on the epitaxial layer; a plurality of first contacts passing through the interlayer insulating layer in a cell region (e.g., of the superjunction semiconductor device); and a plurality of second contacts passing through the interlayer insulating layer in a transition region (e.g., of the superjunction semiconductor device), wherein at least portions of the second contacts in the transition region may extend along a length direction and be spaced apart from each other along a width direction.

According to another aspect of the present disclosure, the superjunction semiconductor device may further include a source in the first body region; and a body contact in contact with the source in the first body region.

According to another aspect of the present disclosure, there is provided a superjunction semiconductor device including a substrate having a cell region and a transition region; an epitaxial layer on the substrate; a plurality of pillars in the epitaxial layer, extending along a length direction and spaced apart from each other along a width direction; a gate on or over the epitaxial layer; an interlayer insulating layer covering the gate and on the epitaxial layer; a first body region in the epitaxial layer, electrically connected to a first one of the pillars in the cell region; and a second body region in the epitaxial layer, electrically connected to a second one of the pillars in the transition region, wherein the second body region may include a plurality of first transition body regions in a first corner region; and a plurality of second transition body regions in a second corner region, and at least portions of the second transition body regions may extend along the length direction.

According to another aspect of the present disclosure, the first transition body regions may extend along the length direction and be spaced apart from each other along the width direction, and the second transition body regions in the second corner region adjacent to the first corner region may also extend along the length direction and be spaced apart from each other along the width direction.

According to another aspect of the present disclosure, the second transition body regions may extend along the length direction.

According to another aspect of the present disclosure, the superjunction semiconductor device may further include a plurality of first contacts passing through the interlayer insulating layer in the cell region; and a plurality of second contacts passing through the interlayer insulating layer in the transition region, wherein the respective second contacts may extend along the length direction and be spaced apart from each other along the width direction.

According to another aspect of the present disclosure, the superjunction semiconductor device may further include a field oxide layer on the epitaxial layer in a ring region (e.g., of the substrate, in which the transition region is between the cell region and the ring region); and a gate runner on the field oxide layer.

According to another aspect of the present disclosure, there is provided a method of manufacturing a superjunction semiconductor device, the method including forming an epitaxial layer on a substrate; forming, in the epitaxial layer, a plurality of pillars extending along a length direction (e.g., of the substrate) and spaced apart from each other in a width direction (e.g., of the substrate); forming a gate on or over the epitaxial layer; forming, in a cell region (e.g., of the substrate), a plurality of first body regions in the epitaxial layer, wherein each of the first body regions is electrically connected to corresponding ones (e.g., in a first subset) of the pillars (e.g., in the cell region); and forming, in a transition region (e.g., of the substrate), a plurality of second body regions in the epitaxial layer, wherein each of the second body regions is electrically connected to corresponding ones (e.g., in a second subset) of the pillars (e.g., in the transition region).

According to another aspect of the present disclosure, the second body regions may have a planar shape or surface extending along a same direction as the pillars.

According to another aspect of the present disclosure, the second body regions may be spaced apart from each other along the width direction.

According to another aspect of the present disclosure, the method may further include forming, in the cell region, a first contact passing through the interlayer insulating layer; and forming, in the transition region, a second contact passing through the interlayer insulating layer.

According to another aspect of the present disclosure, the second contact may correspond to one of the second body regions.

According to another aspect of the present disclosure, there is provided a method of manufacturing a superjunction semiconductor device, the method including forming an epitaxial layer on a substrate; forming, in the epitaxial layer, a plurality of pillars extending along a length direction (e.g., of the substrate) and spaced apart from each other in a width direction (e.g., of the substrate); forming a gate on or over the epitaxial layer; forming, in a cell region (e.g., of the substrate), a plurality of first body regions in the epitaxial layer so that each of the first body regions is connected to a corresponding one of the pillars; and forming, in a transition region (e.g., of the substrate), a plurality of second body regions in the epitaxial layer so that at least portions of the second body regions extend along the length direction and are spaced apart from each other along the width direction.

According to another aspect of the present disclosure, forming the plurality of second body regions may include forming, in a first corner region (e.g., of the transition region), a plurality of first transition body regions extending along the length direction; and forming, in a second corner region (e.g., of the transition region), a plurality of second transition body regions so that at least portions of the second body regions extend along the length direction and are spaced apart from each other along the width direction, and remaining portions of the second body regions extend along the width direction and are spaced apart from each other along the length direction.

According to another aspect of the present disclosure, the method may further include forming, in the cell region, a plurality of first contacts passing through the interlayer insulating layer; and forming, in the transition region, a plurality of second contacts passing through the interlayer insulating layer, wherein the plurality of second contacts may correspond to the second body regions.

The present disclosure has the following effects by the above configuration(s).

According to the present disclosure, at least one body region in the second corner region extends along the length direction in the same manner as the pillar, thereby promoting smooth current flow in the transition/corner region and thus improving reverse recovery characteristics.

Furthermore, according to the present disclosure, since the body region(s) in the second corner region extend along the length direction in the same manner as the pillar, it is possible to improve process efficiency by eliminating any need for a separate implant layer for improving reverse recovery characteristics.

Meanwhile, the effects of the present disclosure are not limited to the effects described above, and other effects not stated directly could be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
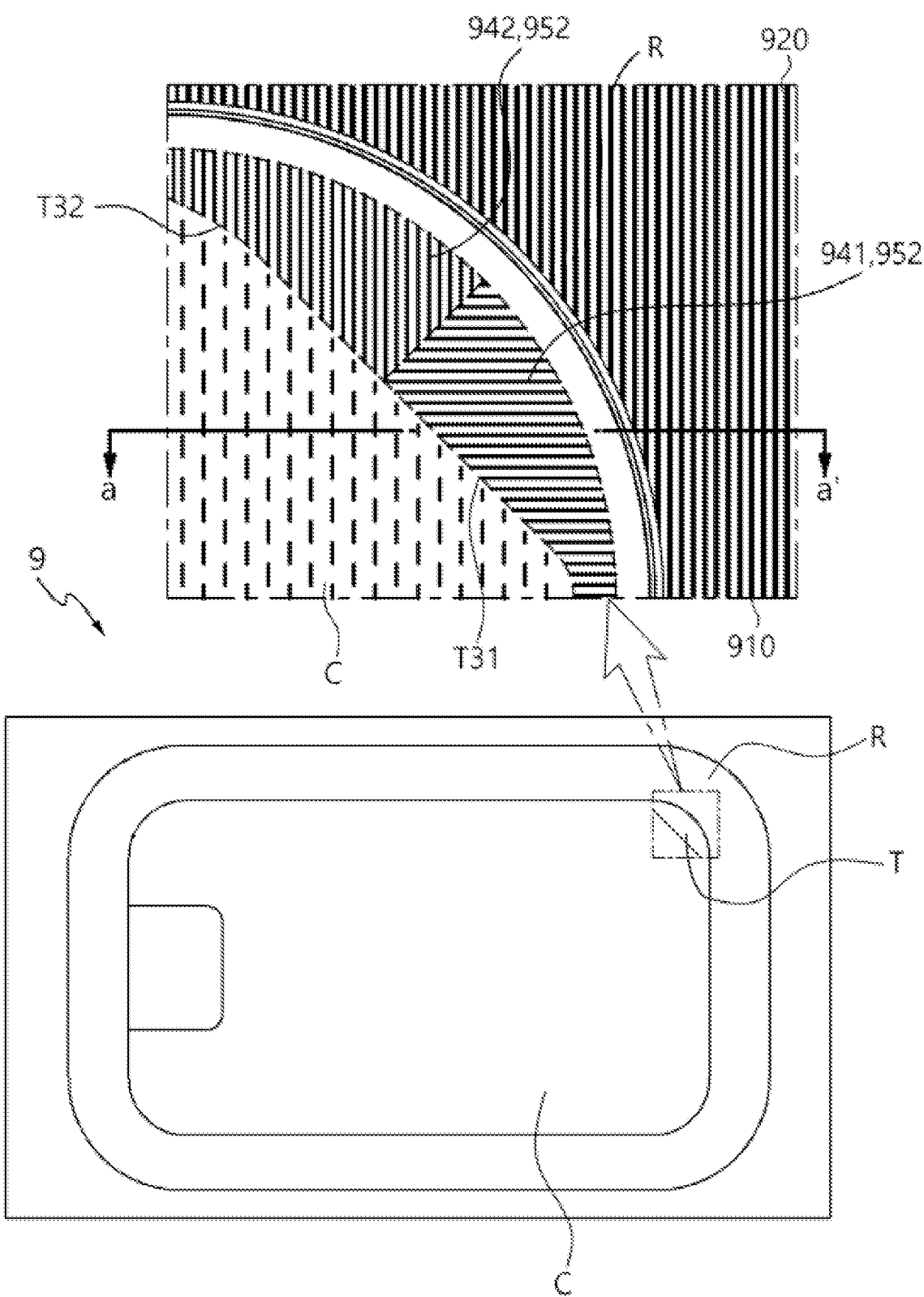
FIG. 1 is a plan view illustrating a superjunction semiconductor device according to the related art.

Reference will now be made in detail to exemplary embodiments of the present disclosure with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

As used herein, the singular forms are intended to include the plural forms as well, unless the context clearly indicates otherwise. It will be further understood that the terms "comprise" and/or "comprising", etc. when used in this specification, specify the presence of stated features, integers, steps, operations, elements, components, and/or combinations thereof, but do not preclude the presence or addition of one or more other features, integers, steps, operations, elements, components, and/or combinations thereof.

As used herein, when an element (or layer) is referred to as being on another element (or layer), it can be directly on the other element, or one or more intervening elements (or layers) may be therebetween. In contrast, when an element is referred to as being directly on or above another component, intervening element(s) are not therebetween. Further, the terms "on", "above", "below", "upper", "lower", "one side", "side surface", etc. are used to describe one element's relationship to one or more other elements illustrated in the drawings.

While the terms "first", "second", "third", etc. may be used herein to describe various items such as various elements, regions and/or parts, these items should not be limited by these terms.

When a certain embodiment may be implemented differently, a specific process order may be performed differently from the described order. For example, two processes described as being performed consecutively may be performed substantially at the same time or performed in an order opposite to the described order.

The term "metal-oxide-semiconductor (MOS)" used herein is a general term. "M" is not limited to only metal, and may include various types of conductors. "S" may be a substrate or a semiconductor structure. "O" is not limited to only oxide, and may include various types of organic or inorganic insulating materials.

In addition, a conductivity type of a doped region or element may be defined as "P-type" or "N-type" according to the main carrier characteristics. However, this is only for convenience of description, and the technical spirit of the present disclosure is not limited to the above-mentioned examples. For example, "P-type" or "N-type" may be replaced with the more general terms "first conductivity type" or "second conductivity type" hereinafter, where the first conductivity type may refer to P type, and the second conductivity type may refer to N type.

It should be further understood that the terms "heavily doped" and "lightly doped" referring to the doping concentration of an impurity region means the relative doping concentration or dose of the dopant element in the impurity region.

In addition, it should be understood that "width direction" may mean an x-axis direction in the drawings, and "length direction" may mean a y-axis direction or a direction or axis orthogonal to the x-axis direction.

Figure 3:
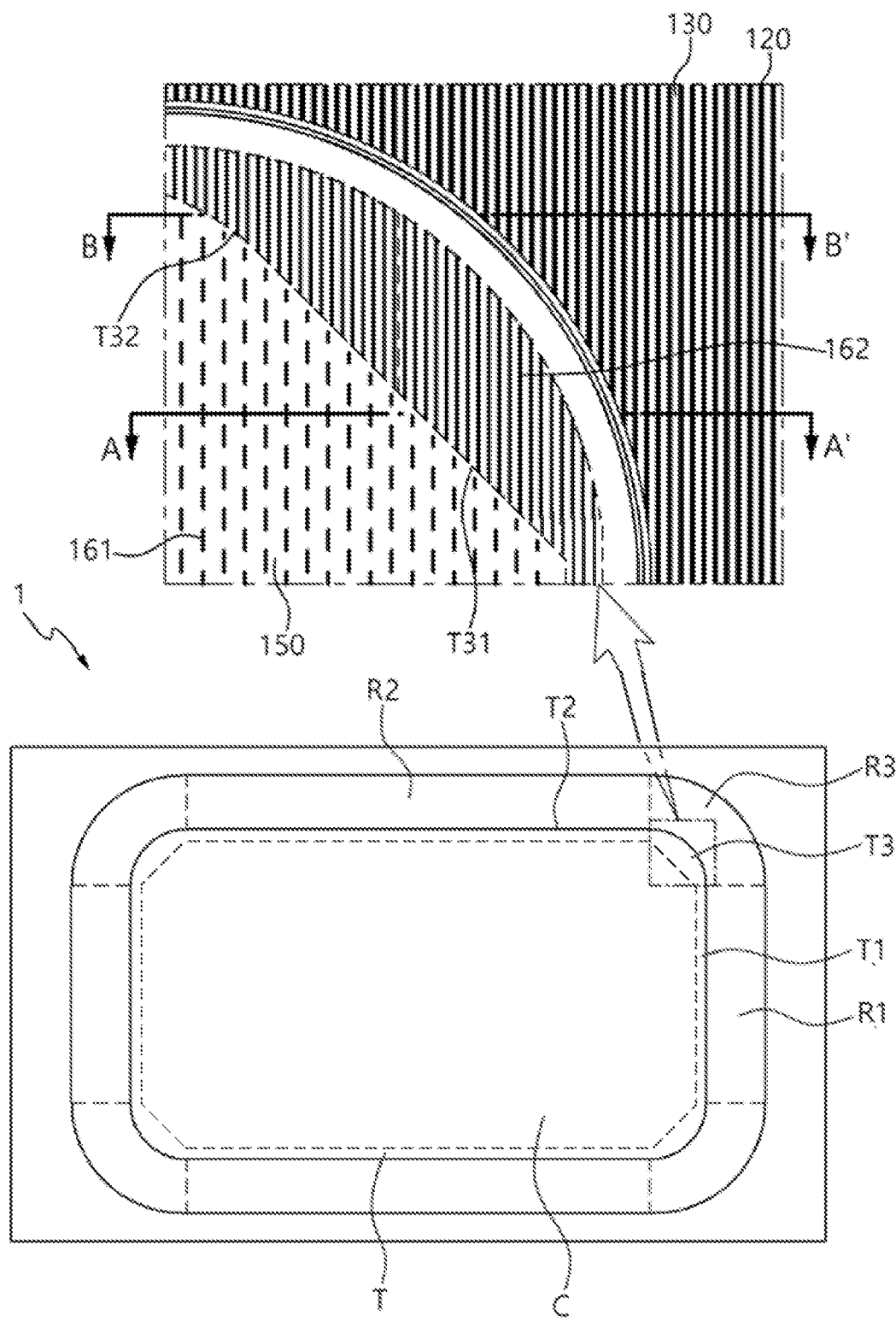
FIG. 3 is a plan view illustrating a superjunction semiconductor device according to one or more embodiments of the present disclosure.
Figure 4:
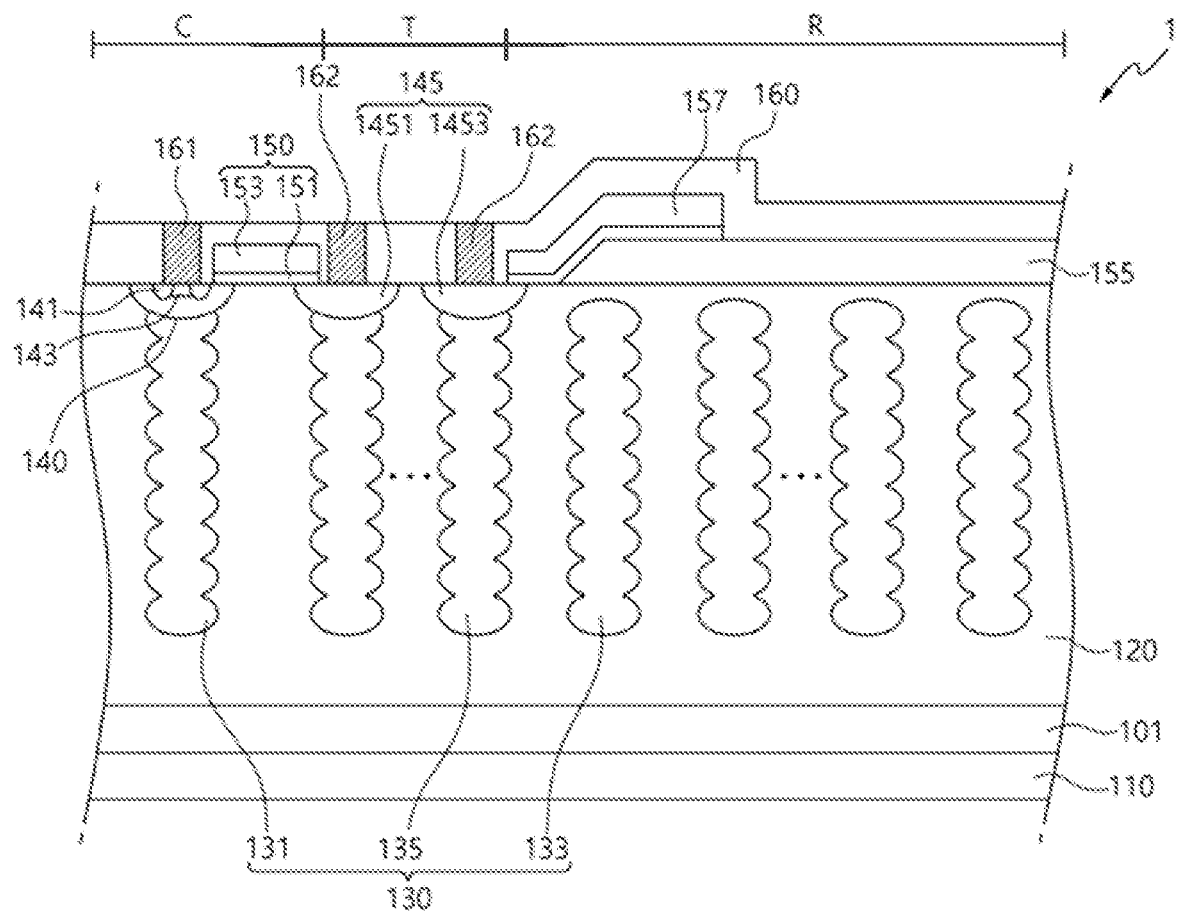
FIG. 4 is a cross-sectional view illustrating the superjunction semiconductor device illustrated in FIG. 3 taken along line A-A' or B-B'.

FIG. 3 is a plan view illustrating a superjunction semiconductor device 1 according to one or more embodiments of the present disclosure. FIG. 4 is a cross-sectional view illustrating the superjunction semiconductor device 1 illustrated in FIG. 3 taken along line A-A' or B-B'.

Hereinafter, the superjunction semiconductor device 1 according to embodiment(s) of the present disclosure will be described in detail with reference to the accompanying drawings.

Before describing the present disclosure in detail, a layout structure of the superjunction semiconductor device 1 according to embodiment(s) of the present disclosure will be described.

Referring to FIG. 3, a cell region C serving as an active region (e.g., of the superjunction semiconductor device 1) is in the center of the device 1, and a ring region R (e.g., including regions R1, R2, and R3) serving as a termination region (e.g., of the superjunction semiconductor device 1) surrounds the cell region C. Hereinafter, in the ring region R, a portion in the width direction (e.g., at an end or edge of the superjunction semiconductor device 1) is referred to as the ring X region R1, a portion in the length direction (e.g., at another end or edge of the superjunction semiconductor device 1) is referred to as the ring Y region R2, and a portion where the ring X region R1 and the ring Y region R2 overlap or are connected is referred to as the ring corner region R3.

In addition, a transition region T is between the ring region R and the cell region C. In the transition region T, a portion in the width direction adjacent to the ring X region R1 is referred to as a transition X region T1, a portion in the length direction adjacent to the ring Y region R2 is referred to as a transition Y region T2, and a portion where the transition X region T1 and the transition Y region T2 overlap or are connected is referred to as a transition corner region T3. In addition, when the transition corner region T3 is roughly divided into two halves, one adjacent to the transition X region T1 is referred to as a second corner region T31, and the other (adjacent to the transition Y region T2) is referred to as a first corner region T32.

Hereinafter, the superjunction semiconductor device 1 according to embodiment(s) of the present disclosure will be described in detail with reference to the accompanying drawings.

Referring to FIGS. 3 and 4, the present disclosure relates to the superjunction semiconductor device 1, and more particularly, to the superjunction semiconductor device 1, in which at least one body region in the second corner region T31 extends along the length direction in the same manner as a pillar, thereby promoting smooth current flow in the transition corner region T3 and thus improving reverse recovery characteristics.

Describing the structure of the device 1, a substrate 101 may be or comprise a silicon substrate, and may further include an epitaxial layer. In addition, a drain electrode 110 may be under (e.g., on a first surface of) the substrate 101.

An epitaxial layer 120 may be on the substrate 101 from the cell region C to the ring region R. The epitaxial layer 120 may be or comprise, for example, a lightly doped impurity region having a second conductivity type. In addition, a plurality of pillars 130 may be in the epitaxial layer 120. The pillars 130 may extend along the length direction and be spaced apart from each other along the width direction. Each of the pillars 130 is an impurity region having a first conductivity type and may extend to a predetermined depth below the surface of the epitaxial layer 120 toward the substrate 101. The epitaxial layer 120 and the pillars 130 may alternate arranged along the width direction at a predetermined depth.

Each of the pillars 130 may have an outer surface extending downwards in the vertical direction, or may have surfaces in contact with the epitaxial layer 120 that are curved in opposite directions. In addition, the pillars 110 may be in the entire cell region C and the ring region R. Hereinafter, for convenience of explanation, a pillar 130 in the cell region C is referred to as a "first pillar 131", a pillar 130 in the ring region R is referred to as a "second pillar 133", and a pillar 130 in the transition region T is referred to as a "third pillar 135". Although the pillars 130 passing in the cell region C may pass through the entire cell region C and the transition region T, and into the ring region R, it should be noted that the first to third pillars 131,133, and 135 are classified for convenience in order to describe the respective pillars 130 in a cross-sectional view having a fixed x- and/or y-coordinate value or value range. In other words, the first pillar 131 illustrated in FIG. 4 may also pass through one or both of the transition regions T (e.g., on opposite sides of the cell region C) and into the adjacent ring region(s) R.

In the cell region C, a first body region 140 may be in and/or at the surface of the epitaxial layer 120. The first body region 140 may comprise an impurity region having the first conductivity type. In addition, a plurality of first body regions 140 may be in the cell region C. The first body regions 140 may be spaced apart from each other along the width direction, and each of the first body regions 140 may be electrically connected to a corresponding one of the pillars 130. In addition, a source 141 and a body contact 143 may be in each of the first body regions 140. The source 141 and the body contact 143 may be in and/or at the surface of the epitaxial layer 120, and may be adjacent to or overlapping each other. The source 141 may comprise a heavily doped impurity region having the second conductivity type, and the body contact 143 may comprise a heavily doped impurity region having the first conductivity type. In addition, one or two sources 141 may be in each of the body regions 140, but are not limited thereto.

In the transition region T, a second body region 145 may be in and/or at the surface of the epitaxial layer 120. The second body region 145 may include a plurality of first transition body regions 1451 extending along the same direction as the third pillar 135 (e.g., the length) in the first corner region T32, and may be spaced apart from each other along the width direction. In addition, the second body region 145 may include a plurality of second transition body regions 1453. At least portions of the second transition body regions 1453 may extend along the same direction as the third pillar 135 (e.g., the length) in the second corner region T31 and be spaced apart from each other along the width direction. In other words, the at least portions of the second transition body regions 1453 (e.g., the entire second transition body regions 1453) in the second corner region T31 may extend along the same direction as the first transition body regions 1451. For example, at least a portion of the second transition body regions 1453 may be electrically connected to a corresponding the third pillar 135, and each second transition body region 1453 may correspond to a third pillar 135 in a 1:1 relationship along the width direction. In FIG. 4, the first transition body region 1451 and the second transition body region 1453 are illustrated together on the cross-sectional view taken along line A-A' or B-B', but this should be understood as meaning that the illustrated body regions 145 may be a first transition body region 1451 or a second transition body region 1453, and there may be a plurality of first transition body regions 1451 and/or second transition body regions 1453 in the cross-section.

Hereinafter, the structure of a superjunction semiconductor device 9 according to the related art and the problems thereof, and the structure of the superjunction semiconductor device 1 according to embodiment(s) of the present disclosure for solving the problems will be described.

Figure 2:
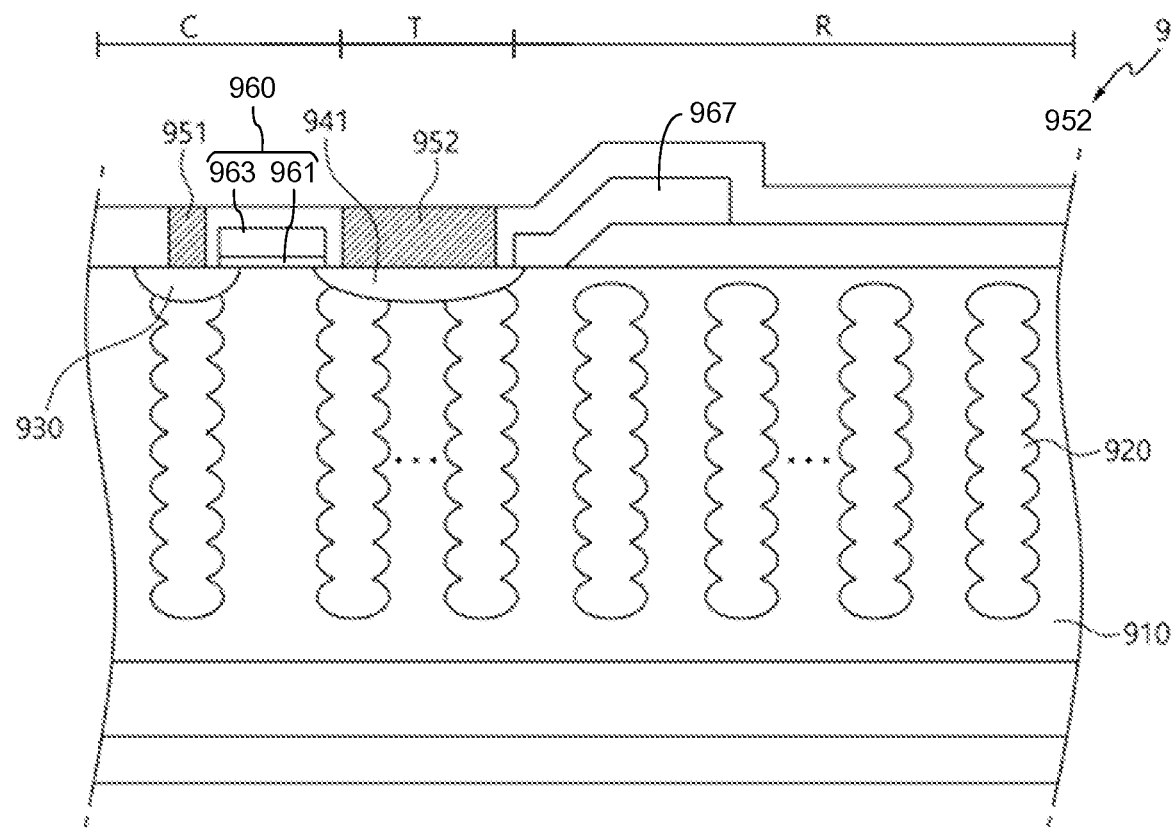
FIG. 2 is a cross-sectional view illustrating the superjunction semiconductor device illustrated in FIG. 1 taken along line A-A'.

Referring to FIGS. 1 and 2, the related-art superjunction semiconductor device 9 has a structure in which a first plurality of second body regions 941 in a second corner region T31 extend along the width direction and are spaced apart from each other along the length direction, and a second plurality of second body regions 942 in a first corner region T32 extend along the length direction and are spaced apart from each other along the width direction, similarly to the pillars 920. In addition, respective contacts 952 on the second body regions 941 and 942 are also aligned with the second body regions 941 and 942 therebelow.

As described above, the second body regions 941 in the second corner region T31 cross the pillars 920 therebelow at an angle of about 90 degrees. In other words, since the axial directions of the pillars 920 and the second body regions 941 in the second corner region T31 do not coincide with each other, this limits easy movement of current the device 9 is switched off. Consequently, reverse recovery characteristics in the second corner region T31 are inevitably relatively weak.

In order to solve such a problem, referring to FIGS. 3 and 4, an objective of the device 1 according to embodiment(s) of the present disclosure is that at least portions of the second transition body regions 1453 (e.g., the entire second transition body regions 1453) extend along the same direction as the second pillar 135 (e.g., the length) in the second corner region T31 and are spaced apart from each other along the width direction, so that the axial directions of the second transition body regions 1453 and the second pillars 135 coincide with each other, thereby achieving relative strengthening of the corresponding PN junction structure(s) and thus enabling formation of smooth current flow in the second corner region T31. In other words, the reverse recovery characteristic of the device 1 can be improved. The second transition body regions 1453 may be in the second corner region T31 at a position adjacent to the first corner region T32, but are not limited thereto. In addition, the second transition body regions 1453 may be in the entire second corner region T31. In other words, all of the second body regions 145 may extend along the length direction in the entire transition corner region T3.

Next, in the cell region C and the transition region T, a gate insulating layer 151 may be on the epitaxial layer 120, and a gate electrode 153 may be on the gate insulating layer 151. The gate insulating layer 151 may comprise, for example, a silicon oxide layer, a high-k dielectric layer, or a combination thereof, but is not limited thereto. The gate electrode 153 may comprise, for example, polysilicon, a metal, a conductive metal nitride, a conductive metal silicide, or a combination thereof, but is not limited thereto. A gate 150 including the gate insulating layer 151 and the gate electrode 153 may be on the epitaxial layer 120. A plurality of gates 150 may be spaced apart from each other along the width direction and extend along the length direction. In other words, the gates 150 may have a "stripe" shape, with the pillars 130 (in the epitaxial layer 120) therebetween in the cell region C. Generally, there are no gates 150 in the transition region T, although the invention is not necessarily limited thereto. In addition, in the ring region R, a field oxide layer 155 may be on the epitaxial layer 120, and a gate runner 157 may be on the field oxide layer 155. In some embodiments, the transition region T does not include the field oxide layer 155 or the gate runner 157, and the ring region R does not include any body regions 140/145 or contacts 161/162.

An interlayer insulating layer 160 may be on the epitaxial layer 120 and may cover the gate electrode 153 and the gate runner 157. The interlayer insulating layer 160 may comprise, for example, one or more oxide layers (e.g., each comprising a doped or undoped silicon dioxide), but is not limited thereto. In addition, a first contact 161 and a second contact 162 may be on the epitaxial layer 120 and may pass through the interlayer insulating layer 160. The first contact 161 may be on each of the first body regions 140 in the cell region C to serve as a source contact. In addition, a second contact 162 may be on the second body region 145 in the transition region T. Both the first contact 161 and the second contact 162 may include, for example, a conductive metal material such as tungsten (W) or aluminum (Al), but are not limited thereto.

The second contact 162 may extend on each second body region 145 along the same direction as the second body region 145. In other words, on the first transition body regions 1451 in the transition region T, a plurality of second contacts 162 may extend along the length direction and be spaced apart from each other along the width direction. In addition, in the second corner region T31, portions or entireties of the second contacts 162 may extend along the length direction and be spaced apart from each other along the width direction. Thus, each of the second contacts 162 in the second corner region T31 may extend along the same direction as a corresponding one of the second transition body regions 1453. As described above, when the second transition body region 1453, the third pillar 135, and the second contact 162 have the same axial orientations or directions, it is possible to achieve relative strengthening of the corresponding PN junction structure(s), and thus promote improved current flow through lowered resistance.

FIGS. 5 to 16 are cross-sectional views illustrating a method of manufacturing a superjunction semiconductor device according to one or more embodiments of the present disclosure.

Hereinafter, a method of manufacturing a superjunction semiconductor device according to one or more embodiments of the present disclosure will be described in detail with reference to the accompanying drawings.

Figure 5:
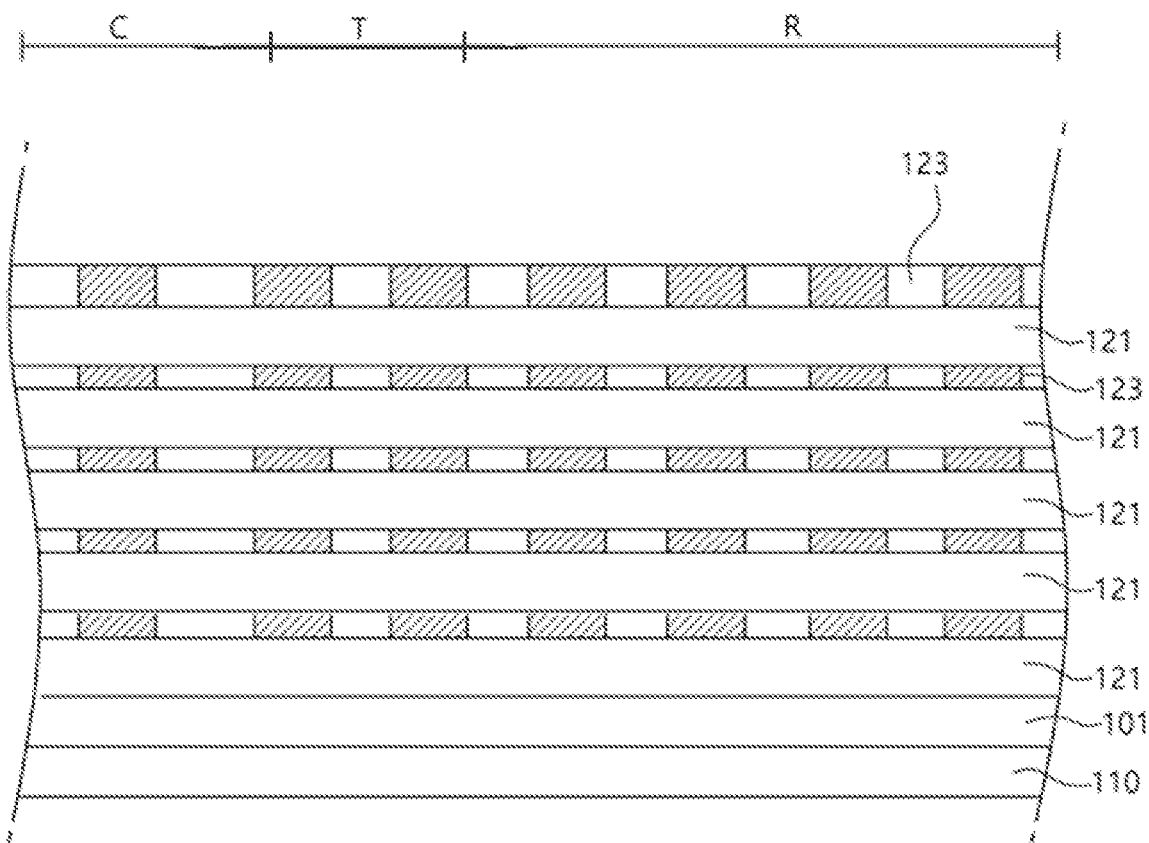
FIGS. 5 to 16 are cross-sectional views illustrating a method of manufacturing a superjunction semiconductor device according to one or more embodiments of the present disclosure.

First, a plurality of pillars 130 may be formed in an epitaxial layer 120. In other words, first to third pillars 131, 133, and 135 may be formed from a cell region C to a ring region R. The formation of the pillars 130 will be described in detail. Referring to FIG. 5, for example, a plurality of epitaxial layers 121 having the second conductivity type may be sequentially formed (e.g., by epitaxial growth), and after the formation of each epitaxial layer 121, an implant layer 123 comprising doped regions (not identified) having the first conductivity type may be formed (e.g., by blanket deposition or epitaxial growth, then ion implantation through a patterned mask in predetermined regions of the implant layers 123) on each epitaxial layer 121.

Figure 6:
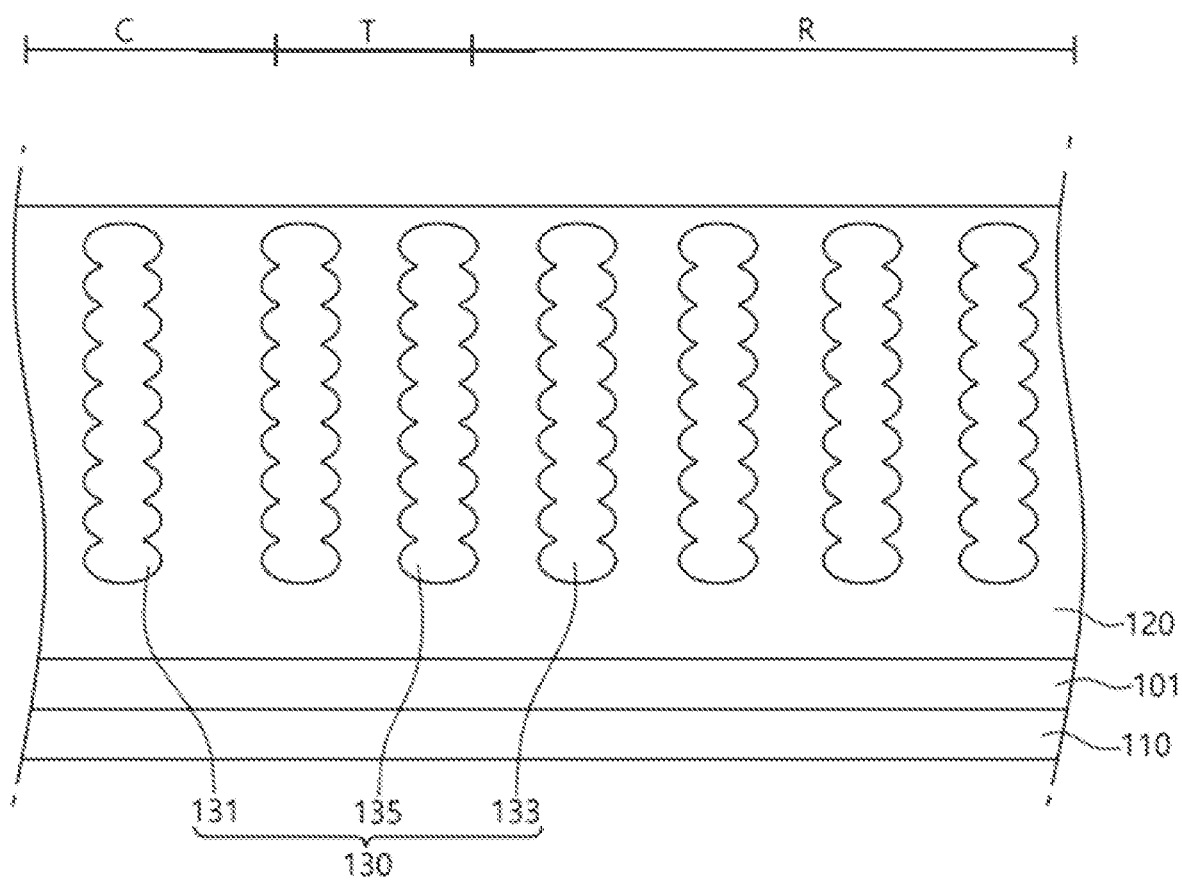
Figure 7:
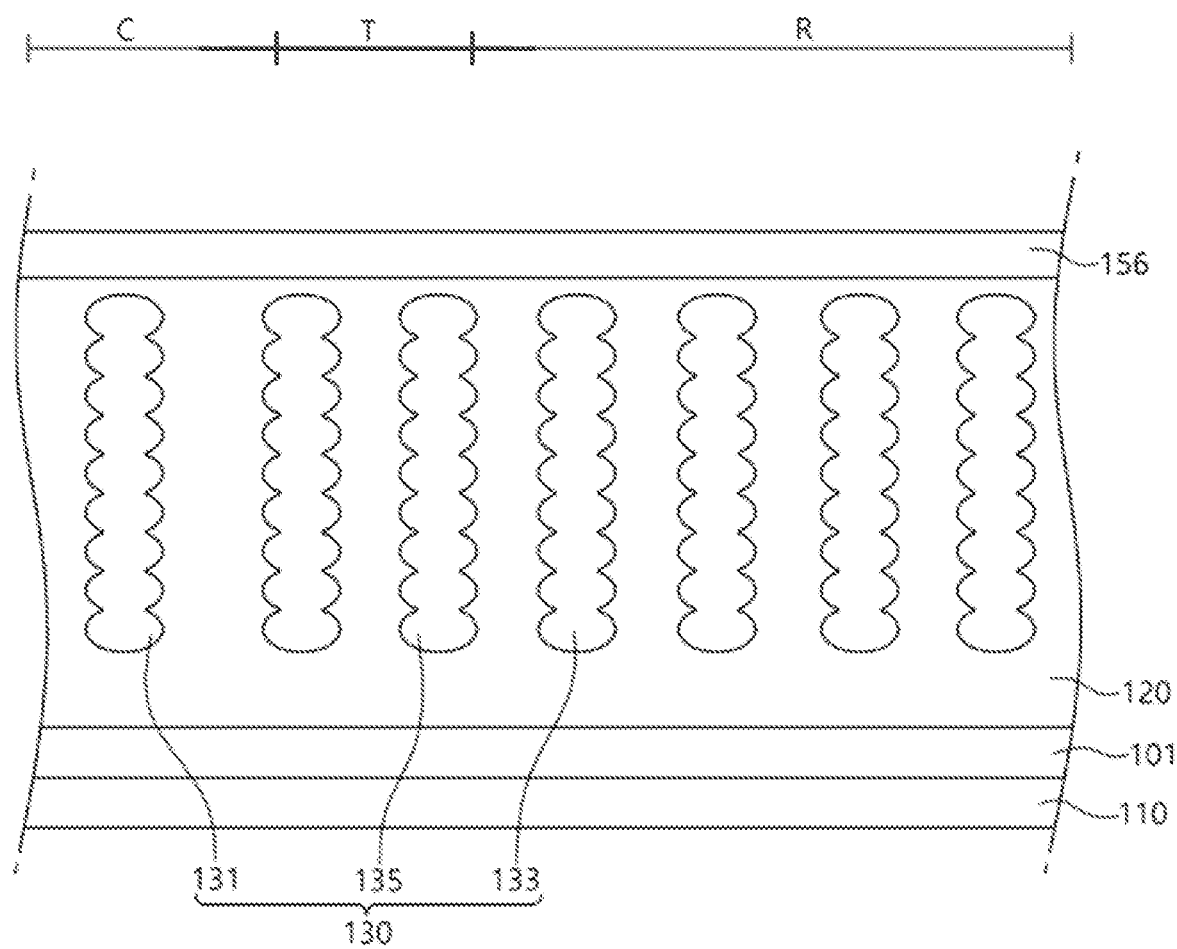
Figure 8:
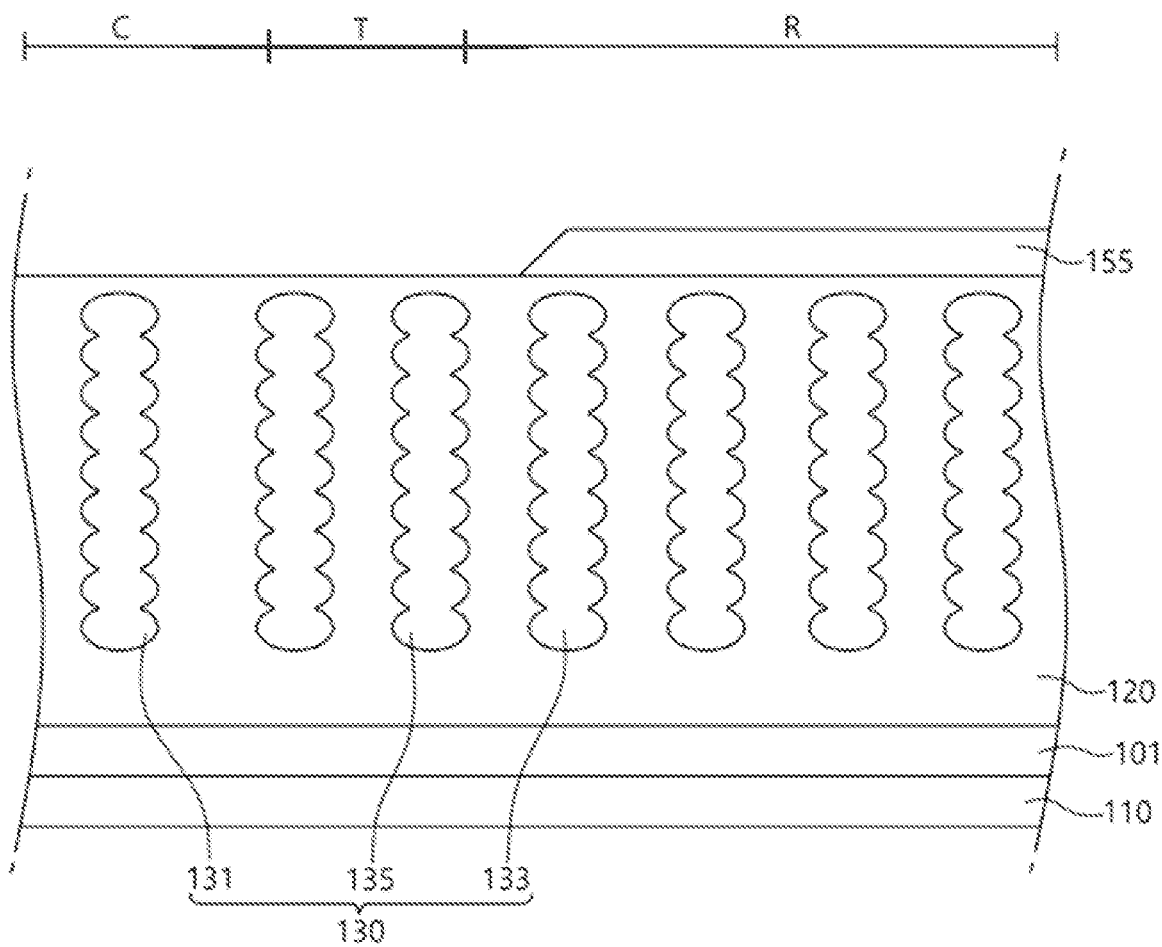

Then, referring to FIG. 6, the pillars 130 may be formed by diffusion (e.g., heat treatment and/or thermal activation). As a result, the respective pillars 130 may extend along the length direction and be spaced apart from each other along the width direction.

Then, a gate insulating layer 151, a gate electrode 153, a field oxide layer 155, and a gate runner 157 may be formed. For example, referring to FIG. 7, an oxide layer 156 (e.g., silicon dioxide) may be formed (e.g., by thermal growth or blanket deposition) on an epitaxial layer 120. Then, referring to FIG. 8, the oxide layer 156 in an area other than that of the field oxide layer 155 (generally the cell region C and the transition region T) may be etched using a patterned mask (not illustrated, but generally formed in the ring region R).

Figure 9:
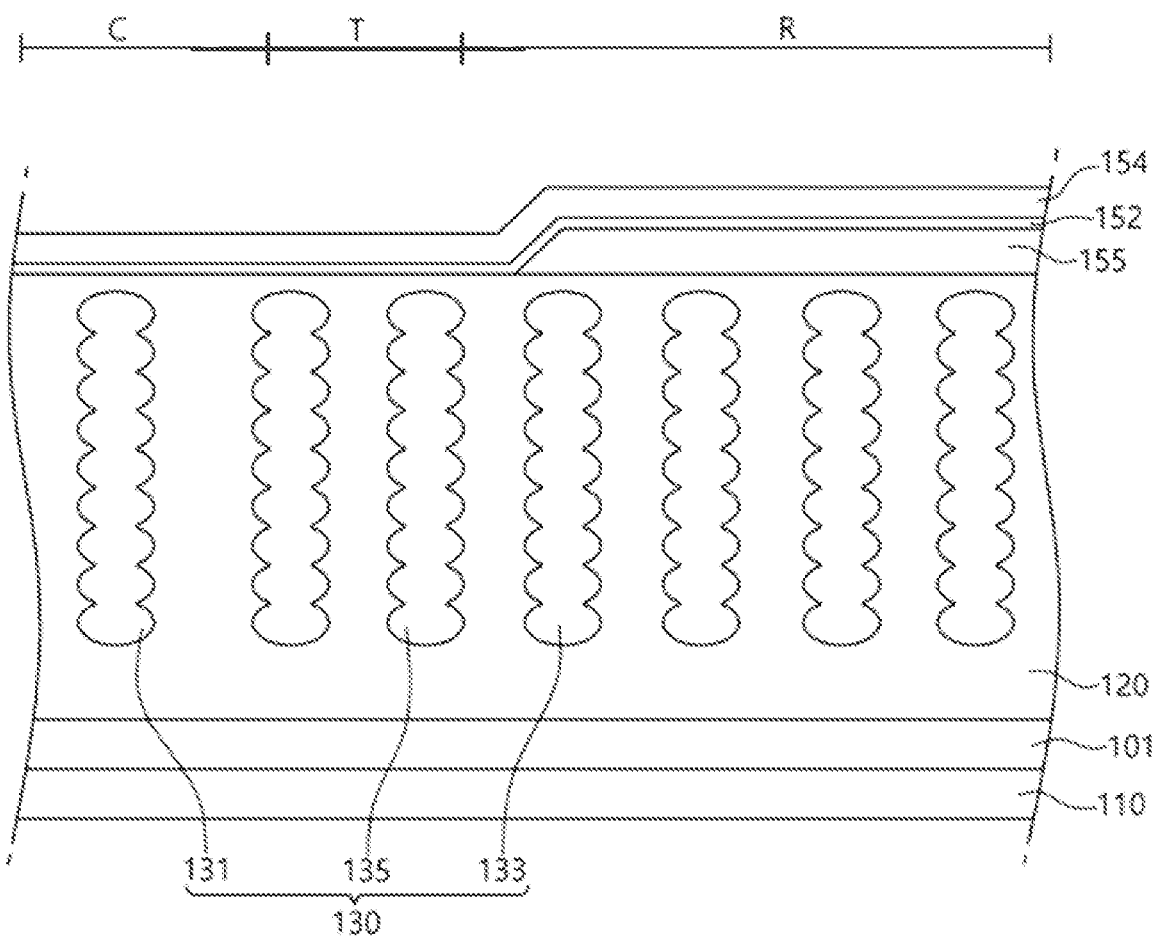
Figure 10:
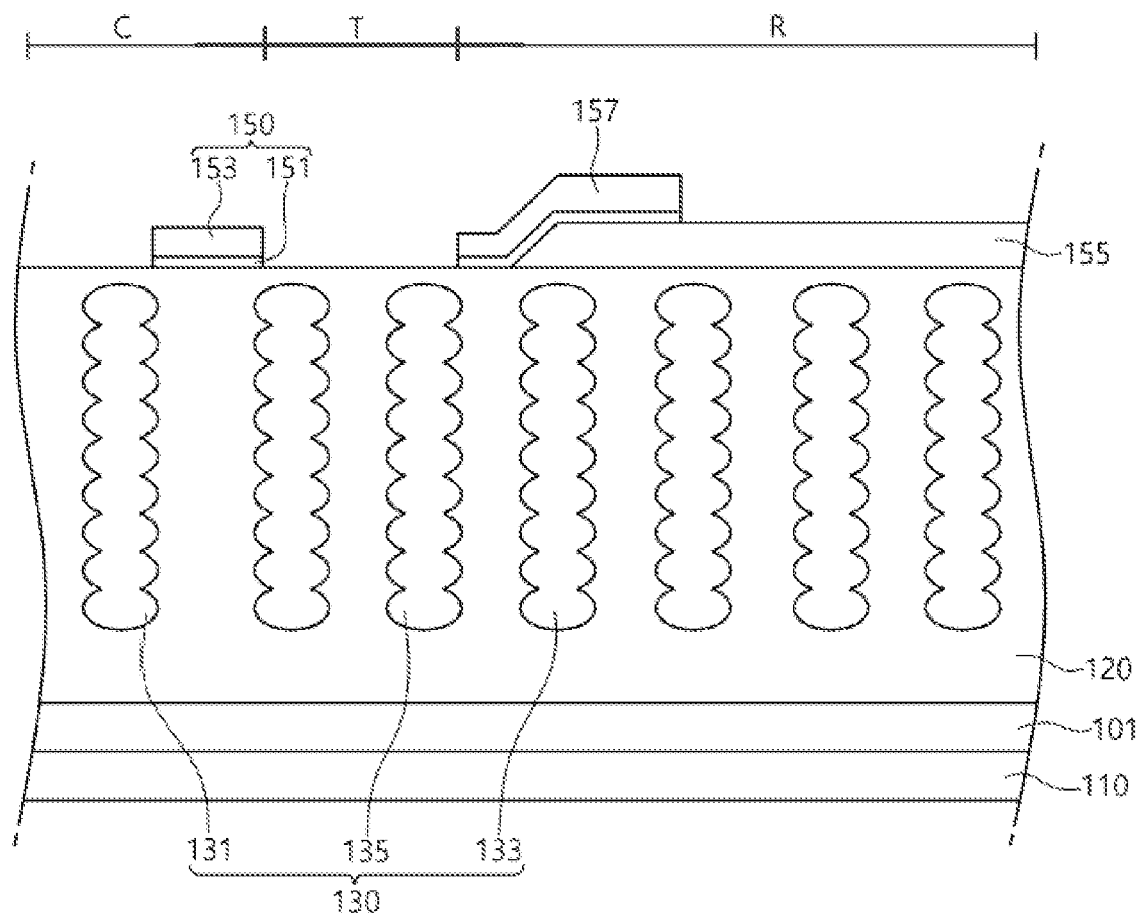

Then, referring to FIG. 9, an insulating layer 152 may be deposited on the epitaxial layer 120 and the field oxide layer 155 (e.g., by blanket deposition, or alternatively, by thermal growth), and a polysilicon layer 154 may be deposited on the insulating layer 152 (e.g., by blanket deposition). Then, referring to FIG. 10, after photolithographic patterning of a mask on areas corresponding to the gate insulating layer 151, the gate electrode 153, and the gate runner 157, the polysilicon layer 154 and the insulating layer 152 may be etched. As a result, the gate insulating layer 151, the gate electrode 153, the field oxide layer 155, and the gate runner 157 may all be formed.

Figure 11:
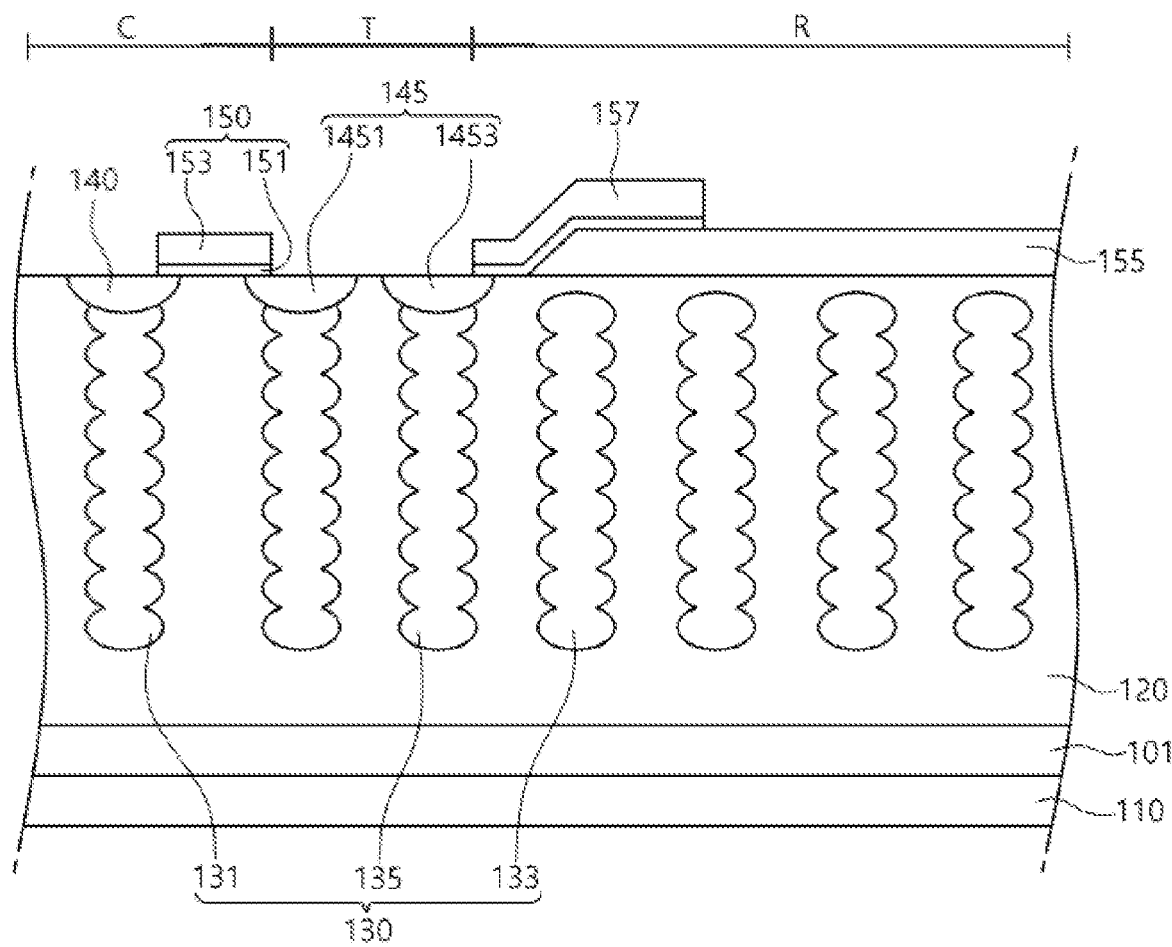

Then, referring to FIG. 11, a first body region 140 (e.g., a plurality of first body regions 140) and a second body region 145 (e.g., a plurality of second body regions 145) may be formed. In detail, for example, the first body region(s) 140 and the second body region(s) 145 may be formed by implanting first conductive type impurities into the epitaxial layer 120 using as a mask the gates 150 in the cell region C and a patterned mask in the transition region T, or the gates 150, the gate runner 157 and the patterned mask in the cell region C and the transition region T. As described above, a plurality of second transition body regions 1451 in a first corner region T32 may extend along the length direction and be spaced apart from each other along the width direction. In addition, at least portions of a plurality of second transition body regions 1453 in a second corner region T31 may extend along the same direction as the pillars 130 and be spaced apart from each other along the width direction. For example, all of the entire second transition body regions 1453 in the second corner region T31 may extend along the same direction as the pillars 130, or only the second transition body region(s) 1453 adjacent to the first transition body regions 1451 in the first corner region T32 may extend along the same direction as the pillars 130, but are not limited thereto.

Figure 12:
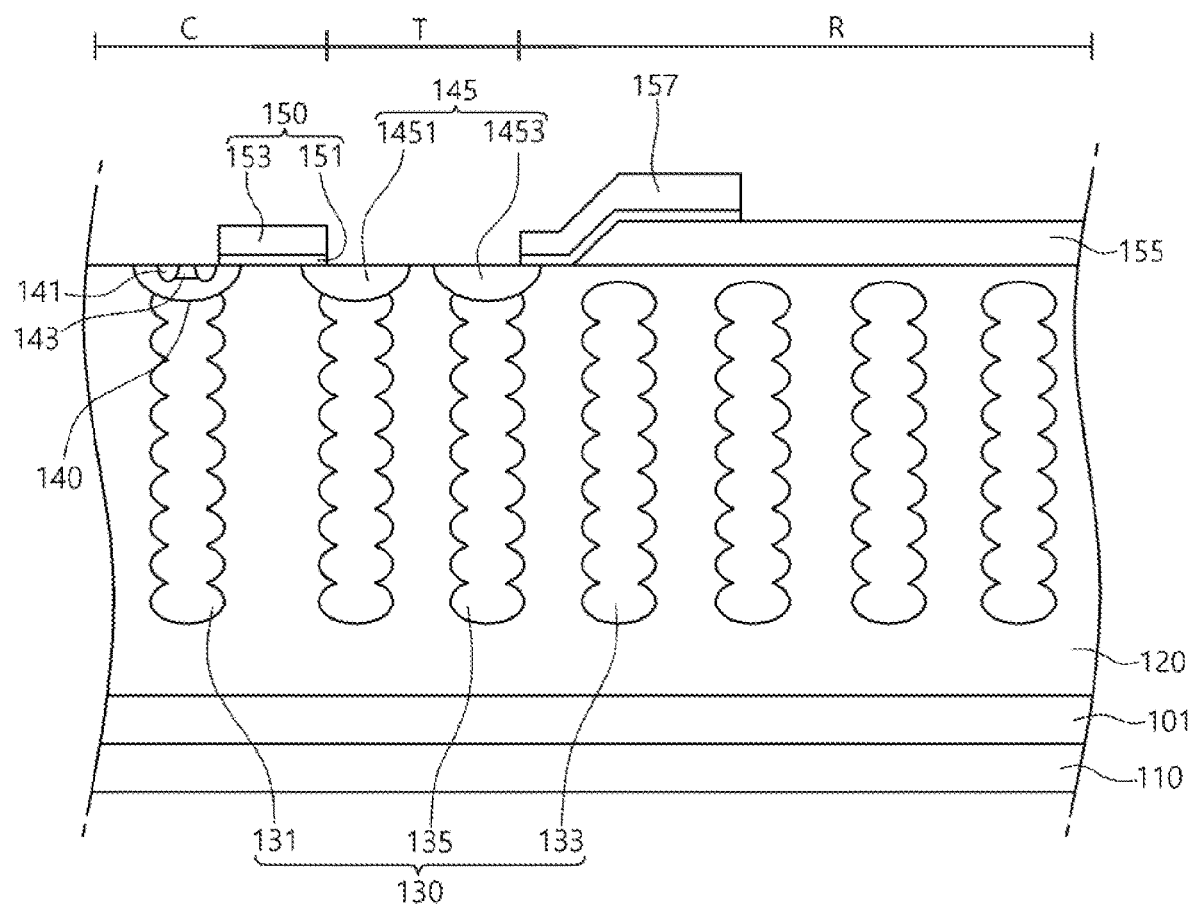

Then, referring to FIG. 12, one or more sources 141 and a body contact 143 may be formed in the first body region 140. For example, the source(s) 141 and the body contact 143 may be formed by implanting second conductivity type impurities into the first body region 140 (e.g., through a patterned mask), and the body contact region 143 may be formed by implanting first conductivity type impurities into the first body region 140 (e.g., through a different patterned mask).

Figure 13:
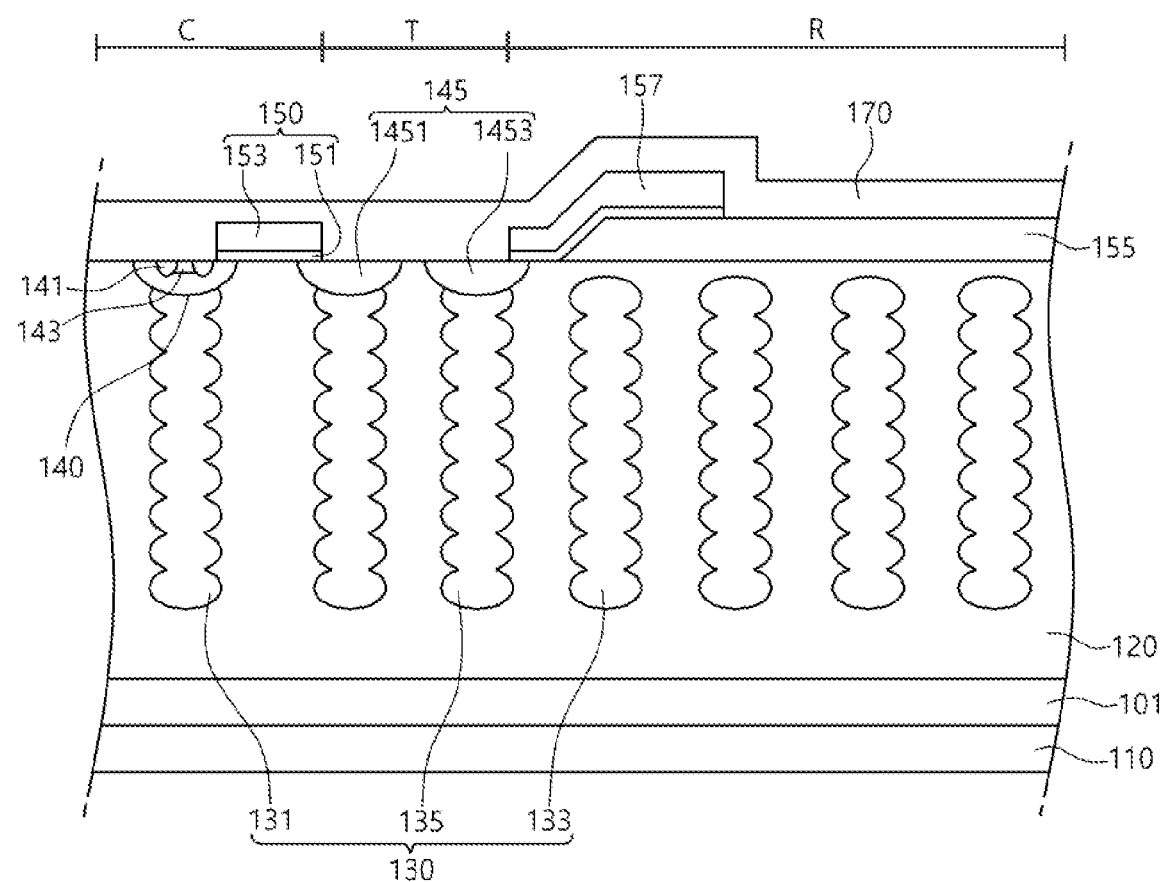
Figure 14:
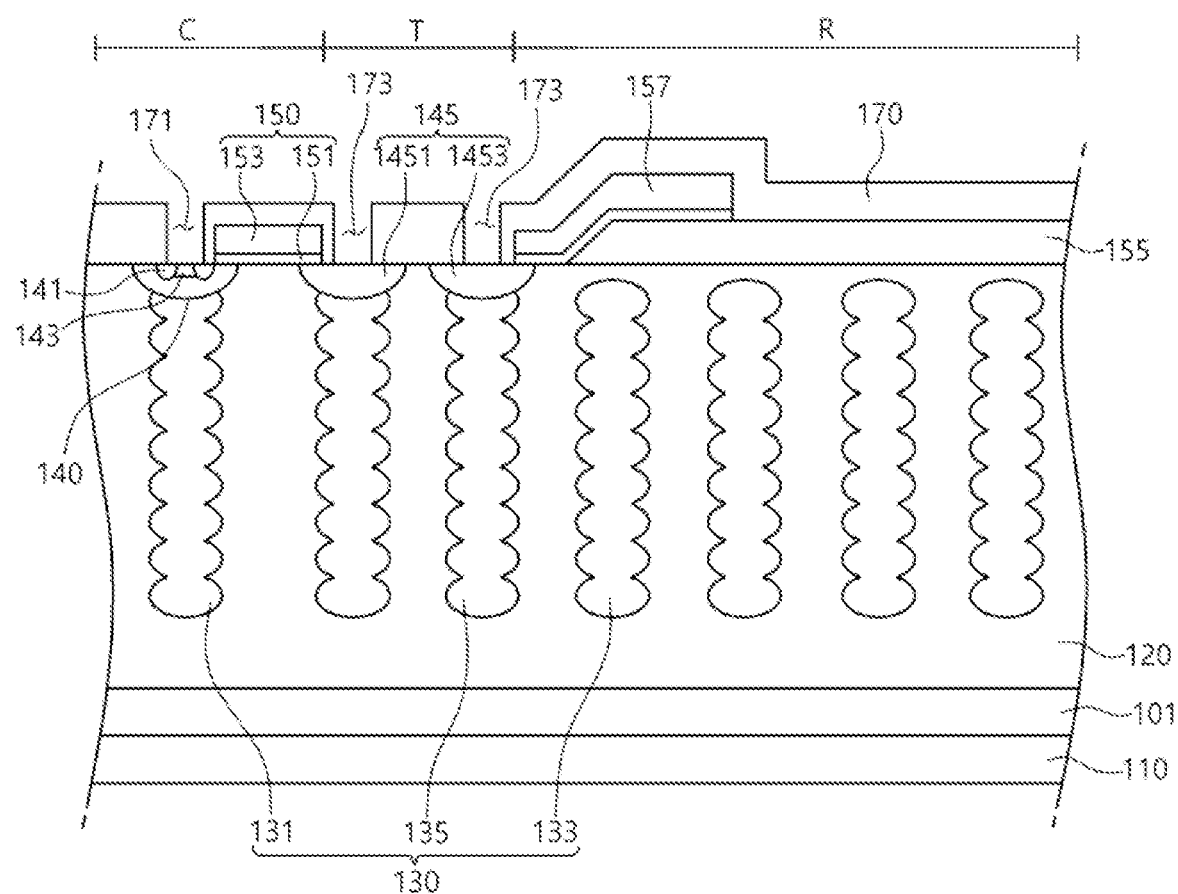
Figure 15:
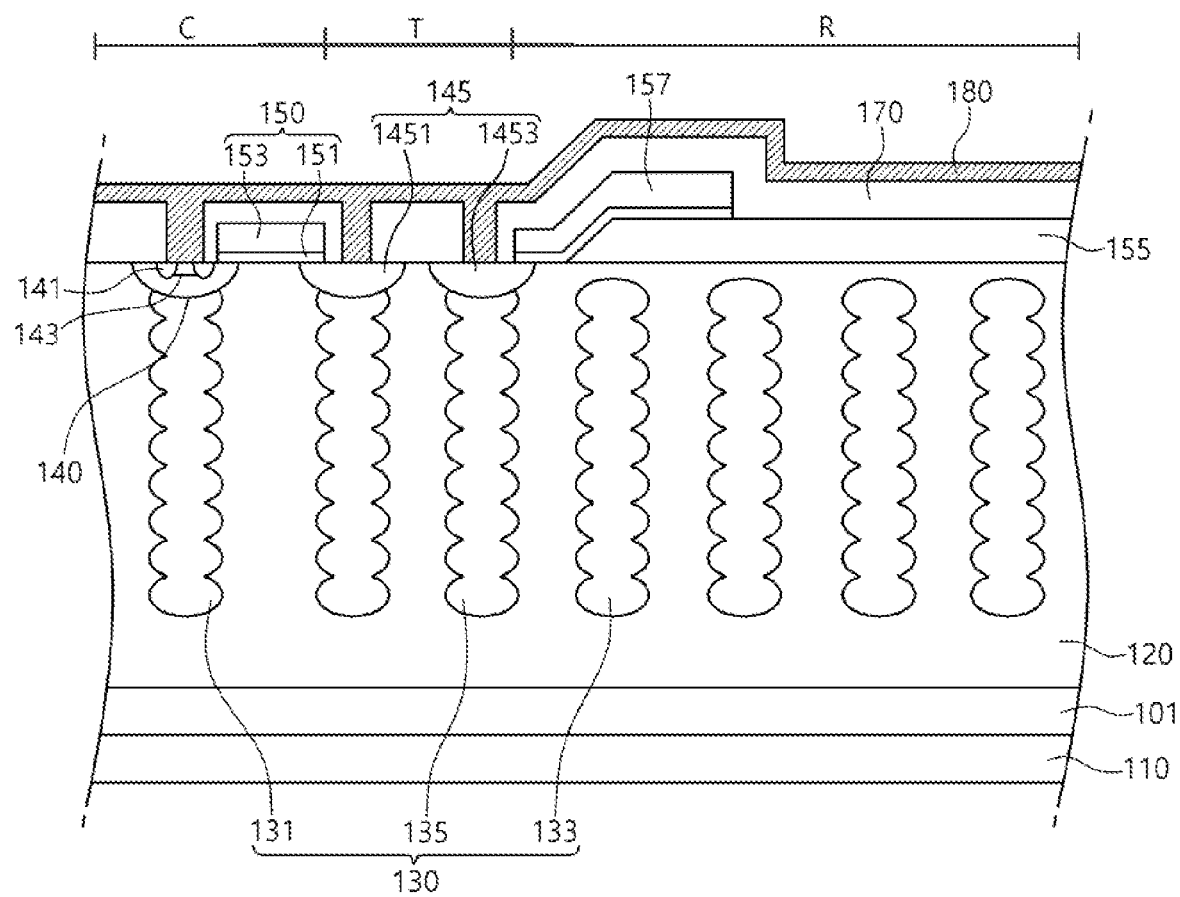
Figure 16:
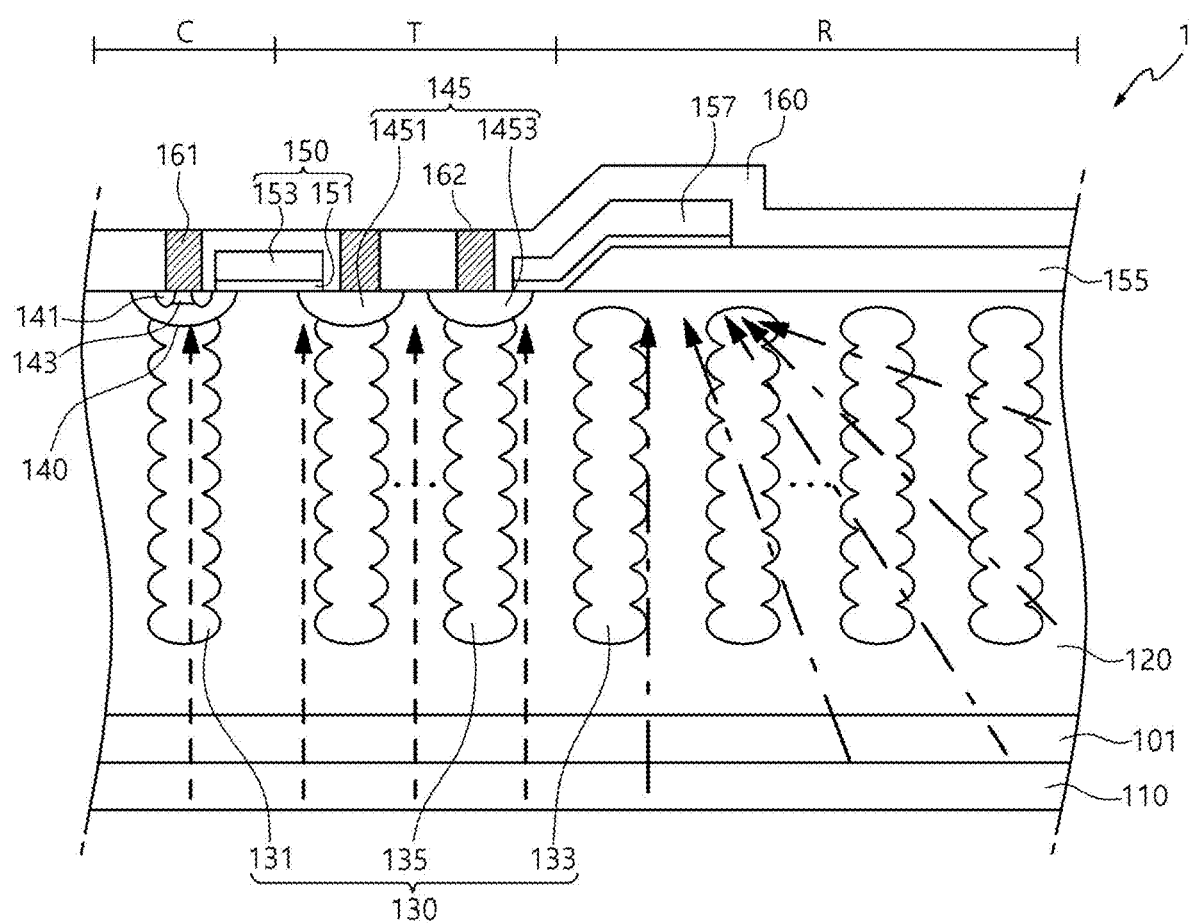

Then, referring to FIG. 13, an interlayer insulating layer 160 may be deposited (e.g., by blanket and/or conformal deposition) on the epitaxial layer 120. Then, referring to FIG. 14, a plurality of contact holes 170 may be formed in the interlayer insulating layer 160. The contact holes 170 are spaces into which the first contacts 161 and the second contacts 162 are formed. The formation of the contact hole 170 will be described. A mask pattern (not illustrated) may be formed on the interlayer insulating layer 160 (e.g., by photolithographic patterning of a photoresist), and then areas of the interlayer insulating layer 160 exposed by openings in the mask pattern may be etched. The contact holes 170 may include one or more first contact holes in the cell region C and a plurality of second contact holes 173 in the transition region T.

In addition, the second contact holes 173 may be formed between adjacent gates 150 in the first corner region T31, and the respective second contact holes 173 may extend along the length direction and be spaced apart from each other along the width direction. In addition, the second contact holes 173 may be formed between adjacent gates 150 in the second corner region T32. At least portions of the second contact holes 173 may extend along the length direction and be spaced apart from each other along the width direction, and the remaining portions thereof may extend along the width direction and be spaced apart from each other along the length direction. In other words, each of the second contact holes 173 may extend in the same direction as the second body region 145 therebelow.

Then, the first contact(s) 161 and the second contacts 162 may be formed in the contact holes 171 and 173. For example, referring to FIG. 15, a metal layer 180 may be deposited on the interlayer insulating layer 160 and in the first contact hole(s) 171 and the second contact holes 173 (e.g., by conformal and/or blanket deposition). For example, the metal layer 180 may be formed by first conformally depositing a liner layer comprising titanium and/or titanium nitride onto the interlayer insulating layer 160 and into the first contact hole(s) 171 and the second contact holes 173 (e.g., along sidewalls of the first contact hole[s] 171 and the second contact holes 173), then blanket-depositing a bulk conductor (e.g., W or Al) onto the liner layer. Then, referring to FIG. 16, the metal layer 180 on the interlayer insulating layer 160 may be removed. The metal layer 180 may be removed by, for example, chemical mechanical polishing (CMP).

The foregoing detailed description may be merely an example of the prevent disclosure. Also, the inventive concept is explained by describing various embodiments and may be used through various combinations, modifications, and environments. That is, the inventive concept may be changed or modified without departing from the scope of the technical idea and/or knowledge in the art. The foregoing embodiments are for illustrating various modes for implementing the technical idea(s) of the present disclosure, and various modifications may be made therein according to specific applications, fields and/or uses of the present disclosure. Therefore, the foregoing detailed description of the present disclosure is not intended to limit the inventive concept to the disclosed embodiments.

What is claimed is:

1. A superjunction semiconductor device comprising:
   a substrate having:
      a cell region in a center of the superjunction semiconductor device, serving as an active region of the superjunction semiconductor device;
      a ring region surrounding the cell region and serving as a termination region of the superjunction semiconductor device, the ring region having a first ring portion in a width direction of the superjunction semiconductor device, a second ring portion in a length direction of the superjunction semiconductor device, and a ring corner portion connecting the first ring portion and the second ring portion; and
      a transition region between the ring region and the cell region, having a first transition portion in the width direction adjacent to the first ring portion, a second transition portion in the length direction adjacent to the second ring portion, and a transition corner portion connecting the first transition portion and the second transition portion;
   an epitaxial layer on the substrate in each of the cell region, the ring region and the transition region;
   a plurality of pillars in the epitaxial layer in each of the cell region, the ring region and the transition region, extending along the length direction and spaced apart from each other along the width direction;
   a first body region in the epitaxial layer in the cell region, electrically connected to a first one of the pillars in the cell region; and
   a plurality of second body regions in the epitaxial layer in the transition corner portion, wherein each of the plurality of second body regions is spaced apart from other one(s) of the plurality of the second body regions along the width direction and is electrically connected to a second one of the pillars in the transition corner portion in a 1:1 relationship,
   wherein all of the second body regions extend along the length direction in an entirety of the transition corner portion.

2. The superjunction semiconductor device of claim 1, further comprising:
   a gate on or over the epitaxial layer in the cell region;
   an interlayer insulating layer covering the gate and on the epitaxial layer, in the cell region, the ring region and the transition region;

a plurality of first contacts passing through the interlayer insulating layer in the cell region; and a plurality of second contacts passing through the interlayer insulating layer and on the plurality of second body regions in the transition region, wherein the second contacts in the transition region extend along a length direction and are spaced apart from each other along a width direction.

3. The superjunction semiconductor device of claim 1, further comprising:

a source in the first body region; and a body contact in contact with the source in the first body region.

4. The superjunction semiconductor device of claim 3, wherein each of the plurality of second body regions has no source or source contact therein.

5. The superjunction semiconductor device of claim 4, wherein the transition region has no gates, and the ring region does not include any body regions or contacts.

6. The superjunction semiconductor device of claim 1, further comprising a field oxide layer on the epitaxial layer in the ring region, and a gate runner on the field oxide layer.

7. The superjunction semiconductor device of claim 6, wherein the field oxide layer is not in the transition region.

8. The superjunction semiconductor device of claim 1, further comprising a plurality of the first body regions in the epitaxial layer in the cell region, electrically connected to the plurality of the pillars in the cell region in a 1:1 relationship.

9. The superjunction semiconductor device of claim 1, comprising a plurality of the first body regions in the epitaxial layer in the cell region, wherein each of the first body regions is connected to a corresponding one of the first pillars.

10. A superjunction semiconductor device comprising:

a substrate having:

a cell region in a center of the superjunction semiconductor device, serving as an active region of the superjunction semiconductor device;

a ring region surrounding the cell region and serving as a termination region of the superjunction semiconductor device, the ring region having a first ring portion in a width direction of the superjunction semiconductor device, a second ring portion in a length direction of the superjunction semiconductor device, and a ring corner portion connecting the first ring portion and the second ring portion; and a transition region between the ring region and the cell region, having a first transition portion in the width direction adjacent to the first ring portion, a second transition portion in the length direction adjacent to the second ring portion, and a transition corner portion connecting the first transition portion and the second transition portion;

an epitaxial layer on the substrate in each of the cell region, the ring region and the transition region;

a plurality of pillars in the epitaxial layer in each of the cell region, the ring region and the transition region, extending along the length direction and spaced apart from each other along the width direction;

a gate in the cell region, on or over the epitaxial layer;

an interlayer insulating layer covering the gate in the cell region and on the epitaxial layer in the ring region and the transition region;

a first body region in the epitaxial layer in the cell region, electrically connected to a first one of the pillars in the cell region; and a plurality of second body regions in the epitaxial layer, electrically connected to a second one of the pillars in the transition region, wherein the plurality of second body regions comprises a plurality of first transition body regions in a first transition corner region of the transition corner portion, and a plurality of second transition body regions in a second transition corner region of the transition corner portion, and the pluralities of the first and second transition body regions extend along the length direction in an entirety of the respective first and second transition corner regions and are spaced apart from each other along the width direction.

11. The superjunction semiconductor device of claim 10, further comprising a plurality of first contacts passing through the interlayer insulating layer in the cell region; and a plurality of second contacts passing through the interlayer insulating layer in the transition region, wherein the second contacts are in contact with the plurality of second body regions, extend along the length direction and are spaced apart from each other along the width direction.

12. The superjunction semiconductor device of claim 10, further comprising:

a field oxide layer on the epitaxial layer in the ring region; and a gate runner on the field oxide layer.

13. The superjunction semiconductor device of claim 12, wherein the field oxide layer is not in the transition region.

14. The superjunction semiconductor device of claim 10, further comprising:

a source in the first body region; and a body contact in contact with the source in the first body region.

15. The superjunction semiconductor device of claim 14, wherein each of the plurality of second body regions has no source or source contact therein.

16. The superjunction semiconductor device of claim 15, wherein the transition region has no gates, and the ring region does not include any body regions or contacts.

17. The superjunction semiconductor device of claim 10, further comprising a plurality of the first body regions in the epitaxial layer in the cell region, electrically connected to the plurality of the pillars in the cell region in a 1:1 relationship.

18. The superjunction semiconductor device of claim 10, comprising a plurality of the first body regions in the epitaxial layer in the cell region, wherein each of the first body regions is connected to a corresponding one of the first pillars.

* * * * *